United States Patent [19]
Jernegan et al.

[11] Patent Number: 5,284,640
[45] Date of Patent: Feb. 8, 1994

[54] GRAPHITE CHUCK HAVING A HYDROGEN IMPERVIOUS OUTER COATING LAYER

[75] Inventors: Michael F. Jernegan, Ritzville; Lyle C. Winterton, Moses Lake, both of Wash.

[73] Assignee: Advanced Silicon Materials, Inc., Moses Lake, Wash.

[21] Appl. No.: 947,882

[22] Filed: Sep. 17, 1992

Related U.S. Application Data

[63] Continuation of Ser. No. 456,730, Dec. 26, 1989, abandoned.

[51] Int. Cl.$^5$ .............................................. C01B 33/03
[52] U.S. Cl. ..................................... 423/349; 423/348
[58] Field of Search ................................. 423/348, 349

[56] References Cited

U.S. PATENT DOCUMENTS

| | | | |
|---|---|---|---|
| 3,286,685 | 11/1966 | Sandmann et al. | 423/349 |
| 3,329,527 | 7/1967 | Harris | 423/349 |
| 3,406,044 | 10/1968 | Harris | 428/408 |
| 3,447,902 | 6/1969 | Benedict et al. | 423/348 |
| 4,068,020 | 1/1978 | Reuschel | 423/348 |
| 4,147,814 | 4/1979 | Yatsurugi et al. | 427/51 |
| 4,621,017 | 4/1986 | Chandler et al. | 428/328 |

FOREIGN PATENT DOCUMENTS

| | | | |
|---|---|---|---|
| 4041901 | 6/1991 | Fed. Rep. of Germany | 423/350 |
| 3123806 | 5/1988 | Japan | 423/349 |

OTHER PUBLICATIONS

Fumio Shimura, J. Appl. Phys. 59(9), 1 May 1986, pp. 3251-3254.
Wijaranakula et al., J. Electrochem. Soc., vol. 138, No. 7, Jul. 1991, pp. 2153-2159.
Sun et al., J. Appl. Phys. 67(9), 1 May 1990 pp. 4313-4319.
"CVD Coating for Industry and Aerospace" by Midland Materials Research, Inc., promotional literature (date unknown).

*Primary Examiner*—Olik Chaudhuri
*Assistant Examiner*—Ken Horton
*Attorney, Agent, or Firm*—Klarquist, Sparkman, Campbell, Leigh & Whinston

[57] ABSTRACT

The present invention is directed to a method for making substantially carbon-free polycrystalline silicon which comprises pyrolyzing a gaseous silicon compound on a heated starter filament mounted on a graphite chuck, said heated starter filament being maintained at a temperature sufficient to effect decomposition of the gaseous silicon compound to form polycrystalline silicon which is deposited thereon and by-product hydrogen, wherein the said graphite chuck is provided with a hydrogen impervious outer coating layer to prevent the by-product hydrogen from reacting with the graphite and form methane which decomposes as carbon on the deposited polycrystalline silicon.

22 Claims, 1 Drawing Sheet

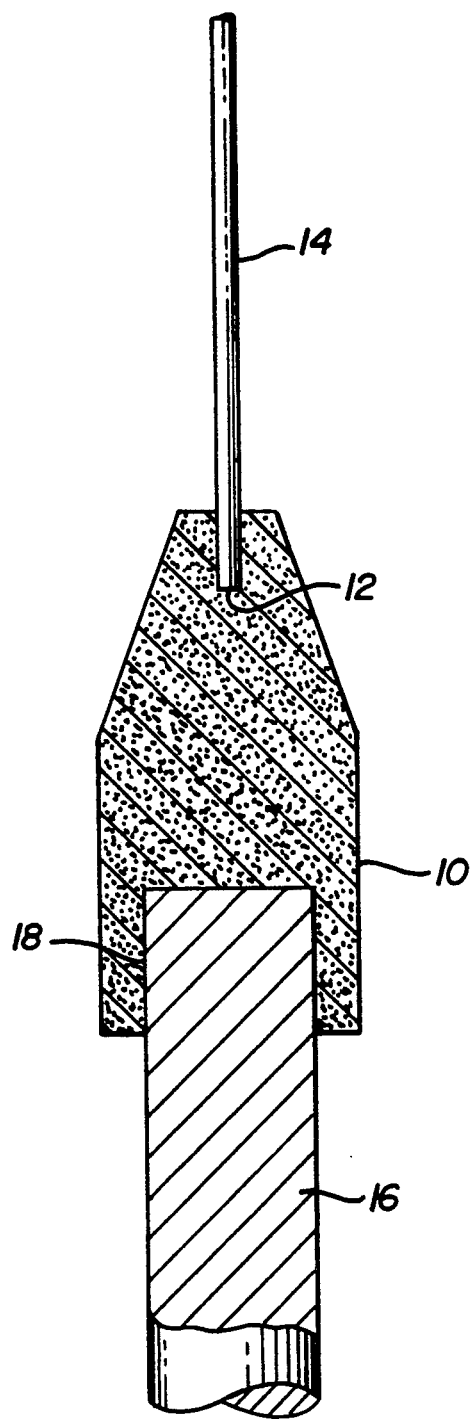

GRAPHITE CHUCK HAVING A HYDROGEN IMPERVIOUS OUTER COATING LAYER

This application is a continuation of application Ser. No. 07/456,730, filed on Dec. 26, 1989, now abandoned.

BACKGROUND OF THE INVENTION

1. Field of the Invention

This invention pertains to the field of producing carbon-free polycrystalline silicon by the pyrolysis of a gaseous silicon compound. More specifically, the present invention relates to a graphite chuck having a hydrogen impervious outer coating layer which is used to support the heated starter filament which thermally decomposes the gaseous silicon compound such that silicon is deposited on the starter filament without carbon contamination.

2. Discussion of Related Art

Polycrystalline rods are primarily used as precursors for making single crystal rods for the semiconductor industry by either the float zone melting process or by the Czochralski crystal pulling technique. These single crystal rods are then processed to form silicon wafers from which silicon chips are made.

Generally, polycrystalline rods are made by the pyrolytic decomposition of a gaseous silicon compound, such as silane or a chlorosilane (e.g., trichlorosilane) on a rod-shaped, red-heated starter filament made preferably from a silicon seed rod or, alternatively, from a high-melting point metal having good electrical conductivity such as tungsten or tantalum. The principles of the design of present state-of-the-art reactors for the pyrolysis of silane and chlorosilanes are set forth in, for example, U.S. Pat. Nos. 3,147,141, 4,147,814, and 4,150,168, which are incorporated herein by reference as if set out in full. It is generally more desirable to prepare the polycrystalline silicon rods by silane pyrolysis so as to avoid the complications caused by the formation of chloride by-products when pyrolyzing chlorosilanes.

The pyrolysis of silane to form silicon and hydrogen, or a chlorosilane which produces chloride-containing compounds such as HCl, $SiHCl_2$ or the like as well as hydrogen, is performed in a reactor consisting of a series of heated filaments, generally silicon rods, surrounded by cooled surfaces. Typically, the filaments are heated by introducing an electrial current through the filament. The process is started with the silicon filament at ambient temperature.

The polycrystalline silicon is produced by heterogeneous decomposition of the silane or chlorosilane on the glowing hot silicon filament rod. The reaction deposits silicon on the surface of the rod and releases hydrogen gas if the silicon is formed by the decomposition of silane, or hydrogen gas in conjunction with other chloride-containing by-product compounds if the source of the silicon is a chlorosilane.

One of the major objectives in the production of polycrystalline silicon is to produce a silicon rod which is a pure as possible. Even slight amounts of contaminants have a major impact on the efficacy of the silicon chips which are ultimately made from this precursor polycrystalline silicon. The prior art techniques for making polycrystalline silicon have had the problem of coping with various contaminants, including carbon. The present invention is specifically directed to reducing the amount of carbon which may be present in such a polycrystalline silicon rod.

While it has been recognized that carbon is undesirably present as a contaminant in the polysilicon rod, there has been no appreciation or recognition as to what the source of such carbon is or how it is contaminating the polysilicon rod. Indeed, without being able to determine the source for such contamination or the means by which such contamination takes place, a solution to this problem has long been awaited.

SUMMARY OF THE INVENTION

By virtue of the present invention, the source and manner by which the polysilicon rod is contaminated with carbon has been determined. Most importantly, a solution to that problem has also been found such that substantially carbon-free polysilicon rods may now be manufactured.

More particularly, as noted above, the gaseous silicon compound which is used as a source for the silicon, is thermally decomposed by means of the heated starter filament. This filament, typically made of a silicon seed rod, is generally heated by passing an electrical current therethrough. Accordingly, this filament must be held securely in place so as to accomodate the growing polysilicon rod that is being deposited thereon while simultaneously being capable of having an electric current passed through it. Typically, a graphite chuck has been utilized by the prior art in order to accomplish both of these objectives. The graphite chuck is made so that: (1) the starter filament may be securely mounted on it, (2) it can be positioned and seated on an electrode which provides the necessary electrical power for the required current, and, most importantly, (3) is electrically conductive so as to be able to conduct the current from the electrode to the filament.

As a result of the present invention, it has been determined that it is this graphite chuck which is the source of the carbon contamination in the polysilicon product. In particular, it has been determined that the hydrogen being formed as a by-product as a result of the pyrolysis of the gaseous silicon compounds, such as silane or chlorosilane, actually reacts with the graphite, i.e., carbon, to form methane. This methane, in turn, then decomposes when it contacts the heated silicon rod to form carbon and yet additional hydrogen. It is this carbon which finds its way into the polysilicon rod as a contaminant.

Now having found the source and mechanism by which the rods are contaminated, the solution to this problem is providing a hydrogen impervious outer coating layer on the graphite chuck. In this manner, the hydrogen is not able to react with the graphite thereby preventing the formation of the methane.

Accordingly, the present invention, in its broadest embodiment is directed to a graphite chuck suitable for mountiung an elongated starter filament in the production of polycrystalline silicon rods by the pyrolytic decomposition of a gaseous silicon compound on said starter filament having a hydrogen impervious outer coating layer.

In a more preferred embodiment, the present invention is directed to a method for making substantially carbon-free polycrystalline silicon which comprises pyrolyzing a gaseous silicon compound on a heated starter filament mounted on a graphite chuck, said heated starter filament being maintained at a temperature sufficient to effect decomposition of the gaseous silicon compound to form polycrystalline silicon which is deposited thereon and by-product hydrogen, wherein the said graphite chuck is provided with a hydrogen impervious outer coating layer to prevent the by-product hydrogen from reacting with the graphite and form methane which decomposes as carbon on the deposited polycrystalline silicon.

In prior art unrelated to the production of polycrystalline silicon by means of pyrolyzing silane or chlorosilanes, graphite articles have been coated with various materials. For example, in U.S. Pat. No. 3,406,044 issued to Harris, it is taught that silicon wafers may be surface treated in epitaxial silicon furnaces. The silicon wafers are placed upon a graphite heating element forming part of the epitaxial silicon furnace and then heated. Harris teaches that these graphite heating elements are rather porous and when subjected to high temperatures will emit considerable amounts of gas. Harris further discloses that this gas often reacts with the silicon wafer causing surface imperfections. Here, in order to prevent the escape of such gases from the graphite material, a first layer of silicon is provided on the graphite followed by a second layer of silicon carbide.

In U.S. Pat. No. 4,621,017 issued to Chandler, et al., graphite articles are provided with a silicon carbide coating which is then treated with aluminum phosphate, which infiltrates into both the graphite as well as the silicon carbide overcoat. The purpose of such a coating is to provide a corrosion and wear resistant graphite article which can be rendered substantially resistant to both corrosion, in the form of oxidation, and wear created by the flow of elevated temperature fluids.

BRIEF DESCRIPTION OF THE DRAWINGS

The FIGURE is a cross-sectional diagram of a graphite chuck made in accordance with the present invention showing the starter filament mounted thereon and also showing the chuck seated on an electrode.

DETAILED DESCRIPTION OF THE INVENTION

The structure or design of the graphite chuck is not narrowly critical to the present invention. Generally, the graphite chuck, as its name implies, must be able to securely hold the starter filament in place, and be able to be positioned on the electrode.

Referring to the FIGURE, a graphite chuck 10 is shown. This graphite chuck is typically provided with a channel 12 which allows for the mounting of starter filament 14 The clearance between filament 14 and channel 12 of graphite chuck is just enough to allow the introduction of the filament but still provide a snug and secure fit.

Generally, the bottom of the chuck is provided with a means for it to be able to be seated and positioned on electrode 16 which provides the electrical power to the pyrolysis process. Typically, the chuck is provided with a channel shown in the diagram as 18 to allow seating of the chuck on the electrode.

The coating that is provided to the outer surface of the graphite chuck should be inert with the graphite and with any of the reactants, products or by-products of the polysilicon production process, including the electrode upon which the graphite chuck is seated. Moreover, the coating that is provided as an outer protective layer should be effective in substantially preventing hydrogen from being able to come into contact with the graphite and reacting therewith.

Materials which are applicable for use as a hydrogen impervious coating include, but are not limited to, silicon carbide, pyrolytic graphite, polycrystalline silicon, tantalum, titanium, tungsten, silicon nitride, silicon oxide, molybdenum, and combinations thereof. Particularly preferred is silicon carbide.

Preferably, the outer protective layer is substantially continuous. The thickness of the layer should be effective to provide the necessary hydrogen imperviousness. This thickness may vary with the particular coating material being used. Generally, the thickness of the hydrogen impervious layer should be at least about 0.1 mil, preferably at least about 1 mil thick, typically in the range of from about 0.5 to about 3 mils. The maximum thickness will not be dictated by effectiveness, for once a minimum thickness is applied to the chuck which will effectively prevent hydrogen from reacting with the graphite, any additional thickness beyond this minimum will generally not provide any further benefit. Beyond this minimum, economics will dictate what the maximum thickness will be.

It is noted that one or more of the materials which may be applicable for being utilized in the present invention may not be very conductive. Accordingly, when using such a material, such as silicon carbide, it is usually desirable not to coat those surfaces of the graphite chuck which are to come into contact with the electrode in order to allow for proper current flow. In contrast, pyrolytic graphite is a an excellent conductor and can be coated over the entire chuck surface before the chuck is mounted onto an electrode.

Other considerations may also dictate the choice of one coating material over another. In particular, some of the above noted coating materials may offer greater scratch resistance than others. This is important in the handling of the chucks and the ease with which it is undesriable removed thereby exposing graphite surfaces to reaction with the hydrogen. Thus, silicon carbide offers high scratch resistance whereas pyrolytic graphite is very susceptible to scratching.

It is also to be noted that while the protective layer is being referred to herein as a coating, the present invention is not limited to a layer which is situated only as the outermost layer. The term "coating layer", as it is being used herein, includes a layer which is present exclusively as the outermost layer of the chuck or a layer which is present not only as the outermost layer but which has also impregnated the chuck to any degree.

The methods for applying any of the above noted coatings to the graphite chuck are well known to those skilled in the art. Any of the conventional techniques for such application are also applicable here. Reference is made to U.S. Pat. Nos. 3,406,044 and 4,621,017 discussed earlier in which a number of such techniques are disclosed and which are incorporated herein by reference.

Generally, with respect to providing a silicon carbide coating for example, silicon carbide may be sublimated at high temperatures of 2000° C. or above and the vapor of silicon carbide is deposited on the graphite chuck to form the coating layer. (See, for example, Japanese Patent Publication No. 41-9322). Alternatively, a gaseous mixture of a chlorine-containing silane compound represented by the general formula $(CH_3)_a SiCl_{4-a}$, in which a is 0, 1, 2 or 3, may be pyrolyzed on the surface of the graphite substrate heated at a high temperature to form silicon carbide in situ. (See, for example, Japanese Patent Publication No. 44-18575). Other techniques for providing a silicon carbide coating are disclosed in U.S. Pat. No. 4,560,589 which is incorporated herein by reference.

To provide a pyrolytic graphite coating layer, methane may simply be decomposed in the presence of the graphite chuck thereby depositing such a pyrolytic graphite.

What is claimed is:

1. A method for making substantially carbon-free polycrystalline silicon which comprises pyrolyzing a gaseous silicon compound on a heated starter filament that consists essentially of silicon, tungsten, or tantalum, and that is mounted on a graphite chuck, said heated starter filament being maintained at a temperature sufficient to effect decomposition of the gaseous silicon compound to form polycrystalline silicon which is deposited thereon and by-product hydrogen, wherein the said graphite chuck is provided with a hydrogen impervious outer coating layer to prevent the by-product hydrogen from reacting with the graphite to form methane which decomposes as carbon on the deposited polycrystalline silicon.

2. The method of claim 1, wherein the gaseous silicon compound is silane.

3. The method of claim 1, wherein the gaseous silicon compound is trichlorosilane.

4. The method of claim 1, wherein the hydrogen impervious outer coating layer is continuous.

5. The method of claim 1, wherein the hydrogen impervious outer coating layer has a thickness of greater than about 0.1 mil.

6. The method of claim 1, wherein the hydrogen impervious outer coating layer has a thickness of greater than about 1 mil 7. The method of claim 1, wherein the hydrogen impervious outer coating layer has a thickness in the range of from about 0.5 to 3 mils.

8. The method of claim 1, wherein the hydrogen impervious outer coating layer is selected from the group consisting of silicon carbide, polycrystalline silicon, tantalum, titanium, tungsten, silicon nitride, silicon oxide, molybdenum and combinations thereof.

9. The method of claim 1, wherein the graphite chuck is provided with a lower channel and is mounted on an electrode which provides current to heat the starter filament.

10. The method of claim 9, wherein the hydrogen impervious outer coating layer is silicon carbide and is not present on the surfaces of the chuck which are in contact with the electrode.

11. The method of claim 1, wherein the hydrogen impervious outer layer is silicon carbide.

12. The method of claim 1, wherein the hydrogen impervious outer layer is polycrystalline silicon.

13. The method of claim 1, wherein the hydrogen impervious outer coating layer is electrically conductive and covers the entire surface of the chuck.

14. A method for making substantially carbon-free polycrystalline silicon by pyrolyzing a gaseous silicon compound on a heated starter filament mounted inside a reactor vessel on an electrode which supplies current to heat the starter filament, the heated starter filament being maintained at a temperature sufficient to effect decomposition of the gaseous silicon compound to form polycrystalline silicon which is deposited thereon and by-product hydrogen, the method comprising:

providing a graphite chuck having a hydrogen impervious outer coating layer;

mounting the coated chuck onto an electrode of a polycrystalline silicon reactor vessel such that the chuck supports a starter filament that consists essentially of silicon, tungsten, or tantalum, and passing electrical current through the electrode, chuck and starter filament in the presence of a gaseous silicon compound, the hydrogen impervious coating preventing by-product hydrogen inside the vessel from reacting with the graphite to form methane which would decompose as carbon on polycrystalline silicon being deposited on the starter filament.

15. The method of claim 14, wherein the gaseous silicon compound is silane.

16. The method of claim 14, wherein the gaseous silicon compound is trichlorosilane.

17. The method of claim 14, wherein the hydrogen impervious outer coating layer is continuous.

18. The method of claim 14, wherein the hydrogen impervious outer coating comprises a material selected from the group consisting of silicon carbide, polycrystalline silicon, tantalum, titanium, tungsten, silicon nitride, silicon oxide, molybdenum, and combinations thereof.

19. The method of claim 14, wherein the hydrogen impervious outer coating layer is electrically conductive and covers the entire surface of the chuck.

20. The method of claim 14, wherein the hydrogen impervious outer coating layer is silicon carbide and is not present on the surfaces of the chuck which are in contact with the electrode.

21. The method of claim 14, wherein the hydrogen impervious outer layer is silicon carbide.

22. The method of claim 14, wherein the hydrogen impervious outer layer is polycrystalline silicon.

* * * * *